(12) United States Patent
Lee

(10) Patent No.: US 8,394,680 B2
(45) Date of Patent: Mar. 12, 2013

(54) LAYOUT FOR SEMICONDUCTOR DEVICE AND METHOD OF FABRICATING THE SEMICONDUCTOR DEVICE

(75) Inventor: Ho Hyuk Lee, Yongin (KR)

(73) Assignee: Hynix Semiconductor Inc, Icheon-Si (KR)

( * ) Notice: Subject to any disclaimer, the term of this patent is extended or adjusted under 35 U.S.C. 154(b) by 331 days.

(21) Appl. No.: 12/650,364

(22) Filed: Dec. 30, 2009

(65) Prior Publication Data
US 2011/0024870 A1  Feb. 3, 2011

(30) Foreign Application Priority Data

Jul. 31, 2009  (KR) .................. 10-2009-0070476

(51) Int. Cl.
*H01L 21/82* (2006.01)
*H01L 21/44* (2006.01)
*H01L 23/52* (2006.01)
*H01L 27/108* (2006.01)
*H01L 29/94* (2006.01)

(52) U.S. Cl. ... 438/129; 257/211; 257/298; 257/E27.07; 257/E21.658; 438/599

(58) Field of Classification Search .................. 257/506, 257/E27.07, E21.085; 438/400, 129, 599
See application file for complete search history.

(56) References Cited

U.S. PATENT DOCUMENTS

| 5,959,321 A | 9/1999 | Lee et al. |
| 6,156,601 A * | 12/2000 | Lee et al. ........................ 438/238 |
| 6,185,120 B1 * | 2/2001 | Takaishi .......................... 365/69 |
| 7,119,389 B2 | 10/2006 | Lee et al. |
| 2005/0218440 A1 * | 10/2005 | Park ............................. 257/298 |
| 2008/0254620 A1 * | 10/2008 | Kim .............................. 438/675 |

FOREIGN PATENT DOCUMENTS

| KR | 10-0502410 B1 | 7/2005 |
| KR | 10-2006-0059037 A | 6/2006 |

* cited by examiner

*Primary Examiner* — Matthew Landau
*Assistant Examiner* — Khaja Ahmad

(57) ABSTRACT

In a layout for a semiconductor device, each active region comprises a first active region, a right active region on the right side of the first active region, a left active region on the left side of the first active region, an upper active region on the upper side of the first active region and a lower active region on the lower side of the first active region, wherein the first active region, the right active region, the left active region, the upper active region and the lower active region each have an inclined portion having a bit-line contact region; and first and second portions having a storage node contact region, first and second ends formed on left and right ends of the inclined portion at a predetermined tilt angle with respect to the inclined portion, the active region being intersected by two word lines and one bit line.

18 Claims, 6 Drawing Sheets

LAYOUT FOR SEMICONDUCTOR DEVICE AND METHOD OF FABRICATING THE SEMICONDUCTOR DEVICE

CROSS-REFERENCE TO RELATED APPLICATION

The present application claims priority to Korean patent application number 10-2009-70476, filed on 31 Jul. 2009, which is incorporated by reference in its entirety.

BACKGROUND OF THE INVENTION

The present invention relates to a semiconductor device and a method of fabricating the semiconductor device. More particularly, the present invention relates to a layout arrangement and design for active regions and device isolation films of a semiconductor device, and to a method of fabricating the semiconductor device having the layout.

In recent years, there has been an increasing demand for large-capacity DRAMs (Dynamic Random Access Memories). However, a is size limit on the chip has placed a constraint on the increase of the DRAM capacity. When the chip size increases the number of chips per wafer should decrease, leading to the reduction in yield. Accordingly, great efforts have been made to change the cell layout so as to reduce the cell area and thus to integrate a larger number of memory cells in one wafer. With such efforts, the traditional 8F2 layout is now changing into the 6F2 layout.

FIG. 1 shows the 8F2 (or $8F^2$) layout for a semiconductor device according to the conventional art. Referring to FIG. 1, an active region 10 is formed of a rectangular or oval-shaped bar, and a device isolation film 20 defines active regions 10. In each of the active region 10, two word lines 30 and one bit line 40 intersect one another. Each active region 10 includes a bit-line contact region 13 and a storage node contact region 15. The bit-line contact region 13 defines a region where the active regions 10 and the bit line 40 are connected. The storage node contact region 15 defines a region where the active regions 10 and a capacitor (not shown) are connected.

A gate is formed at a portion of intersection of the word lines 30 and the active regions 10, and ions are implanted into the active regions 10 on either side of the gate to form a junction region for a source and a drain, with the source, the drain and the gate constituting a transistor. One transistor and one capacitor consist of one cell, and a relation between the minimum critical dimension (hereinafter referred to as 'F') of a semiconductor device and the cell area categorizes layouts of semiconductor devices as 8F2, 6F2 or 4F2.

In case of the semiconductor device shown in FIG. 1, the width of the active region 10 or word line 30 or bit line 40 becomes the minimum critical dimension F. Because a cell is 4F long in the transverse direction and 2F long in the longitudinal direction, the area of the cell becomes 4F×2F or 8F2. This cell layout is called 8F2.

Layouts for a DRAM device known so far include 8F2, 6F2 and 4F2, and among these the 4F2 layout has the highest cell density. In case of the 4F2 layout, however, the active regions should be formed in a cylindrical shape, a vertical type gate should be used, and a severe noise is generated between the lines. Thus, the 4F2 layout has many problems yet to be solved down the road before mass production.

Well-known examples of the 8F2 layout configuration include, for example, bar-shape, T-shape and star cell, and well-known examples of the 6F2 layout configuration include, for example, bar-shape and tilted bar-shape. There is an on-going effort to reduce the density of a unit cell in a DRAM device.

BRIEF SUMMARY OF THE INVENTION

Embodiments of the invention are directed to a layout for a semiconductor device that allow one or more the following: a layout that allow a larger number of capacitors within the same area to increase the cell density; a layout that enables a larger number of semiconductor chips to be obtained from a wafer; a layout that retains a sufficient gap between bit lines to prevent SAC failure of the storage node.

In one embodiment of the present invention, a layout for a semiconductor device includes active regions, device isolation films for is defining the active regions, bit lines and word lines, wherein each active region comprises a first active region, a right active region located on the right side of the first active region, a left active region located on the left side of the first active region, an upper active region located on the upper side of the first active region and a lower active region located on the lower side of the first active region, wherein the first active region, the right active region, the left active region, the upper active region and the lower active region respectively include an inclined portion having a bit-line contact region; and first and second portions having a storage node contact region, with the first end and the second end being respectively formed on the left and right ends of the inclined portion at a predetermined tilt angle with respect to the inclined portion. Also, in the active region there are two word lines and one bit line intersecting one another so that a larger number of capacitors can be formed within a given area and this in turn increases the cell density and enables to get a larger number of semiconductor chips from one wafer.

Further, the inclined portion and the word lines are preferably formed perpendicularly to one another.

In addition, the first and second ends of the active region are formed at an angle of 125° to 145°, preferably 135° with respect to the inclined portion, and the area of a unit cell defined by a part of the inclined portion and the first end 5.5 $F^2$ (F=Width of the active region).

Moreover, the second end of the first active region is formed in a transverse position with the first end of the right active region, and the first end of the first active region is formed in a transverse position is with the second end of the left active region.

Still further, a transverse distance between the second end of the first active region and the first end of the right active region, and a transverse distance between the first end of the first active region and the second end of the left active region are approximately 0.5F (F=Width of the active region).

Also, a straight line formed by connecting the second end of the upper active region, the second end of the first active region and the second end of the lower active region is preferably normal to the inclined portion.

Likewise, a vertical distance between the second end of the upper active region and the second end of the first active region, and a vertical distance between the second end of the first active region and the second end of the lower active region are approximately 0.5F (F=Width of the active region).

Also, the bit line is preferably tilted right-downwardly at a predetermined angle. Most preferably, the bit line is tilted about −9° from the X-axis.

An embodiment of the present invention further provides a method of fabricating a semiconductor device, particularly a method of fabricating a semiconductor device including active regions, device isolation films for defining the active regions, bit lines and word lines, wherein each active region comprises a first active region, a right active region located on the right side of the first active region, a left active is region located on the left side of the first active region, an upper active region located on the upper side of the first active region and a lower active region located on the lower side of the first active region, wherein the first active region, the right active region, the left active region, the upper active region and the lower active region respectively include an inclined portion having a bit-line contact region; and first and second portions having a storage node contact region, with the first end and the second end being respectively formed on the left and right ends of the inclined portion at a predetermined tilt angle with respect to the inclined portion. Also, in the active region there are two word lines and one bit line intersecting one another so that a larger number of capacitors can be formed within a given area and this in turn increases the cell density and enables to get a larger number of semiconductor chips from one wafer.

In addition, the method further comprises: forming a line-type active region pattern with the first active region, the left active region and the right active region; and forming device isolation films for separating the first end of the first active region and the second end of the left active region and for separating the second end of the first active region and the first end of the right active region. In this manner, patterning of the active region is more facilitated.

Here, the formation of the device isolation film can be performed using a contact hole mask or a line-type mask.

The method further comprises: after the formation of the active region, forming a storage node contact between the first end of the first active region and the second end of the left active region and is between the second end of the first active region and the first end of the right active region; and splitting the storage node contact between the first end of the first active region and the second end of the left active region and between the second end of the first active region and the first end of the right active region. In this manner, the formation of the storage node contact is also facilitated.

Further, the inclined portion and the word lines are preferably formed perpendicularly to one another, and the first and second ends of the active region are most preferably formed at an angle of 135° with respect to the inclined portion.

Moreover, the second end of the first active region is formed in a transverse position with the first end of the right active region, and the first end of the first active region is formed in a transverse position with the second end of the left active region.

Also, the bit line is preferably inclined right-downwardly at a predetermined angle. Most preferably, the bit line is inclined about −9° from the X-axis.

DESCRIPTION OF EMBODIMENTS

An exemplary embodiment of a layout for a semiconductor device is according to the present invention and a method of fabricating the semiconductor device will now be described in greater detail with reference to the accompanying drawings.

Figure 1:
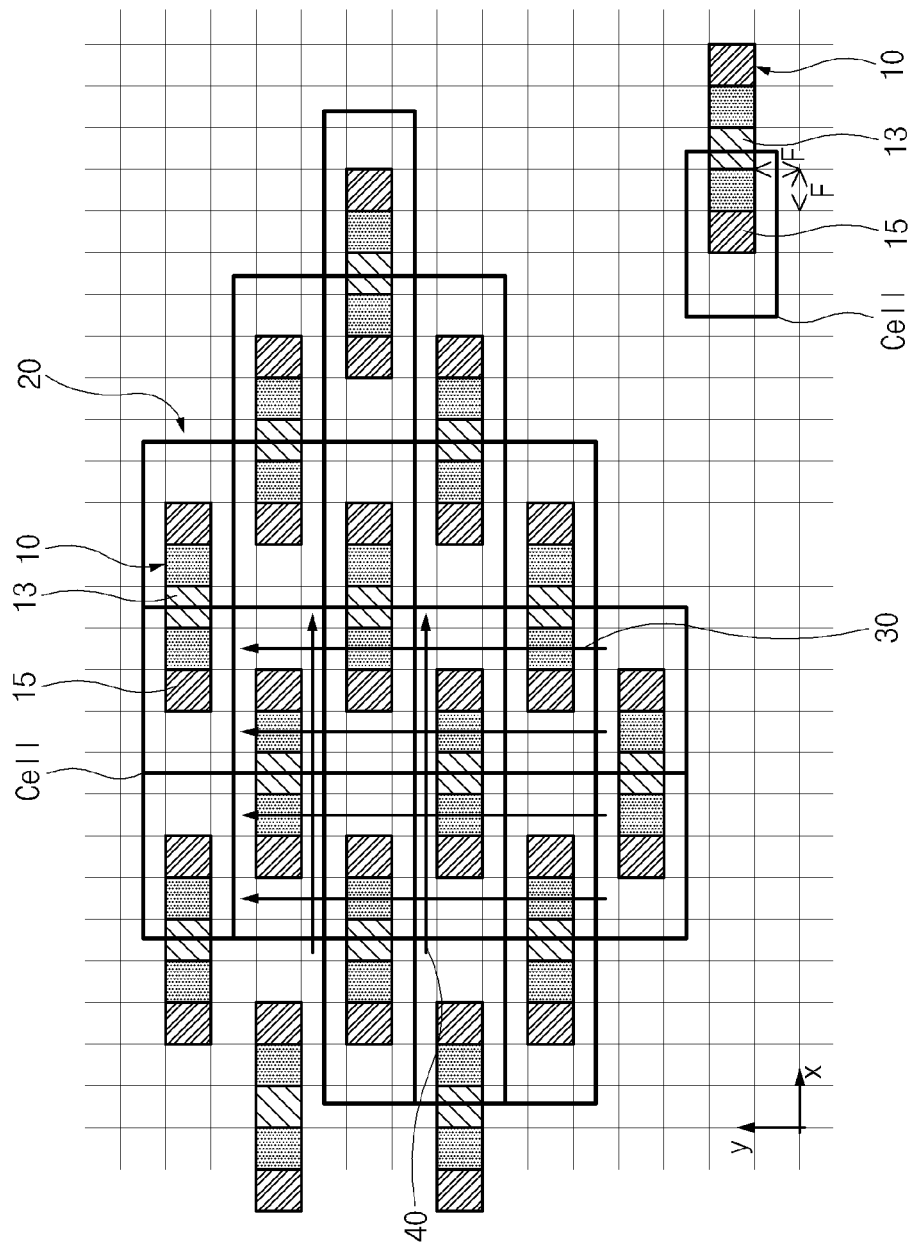
FIG. 1 shows the 8F2 layout for a semiconductor device according to the conventional art.
Figure 2:
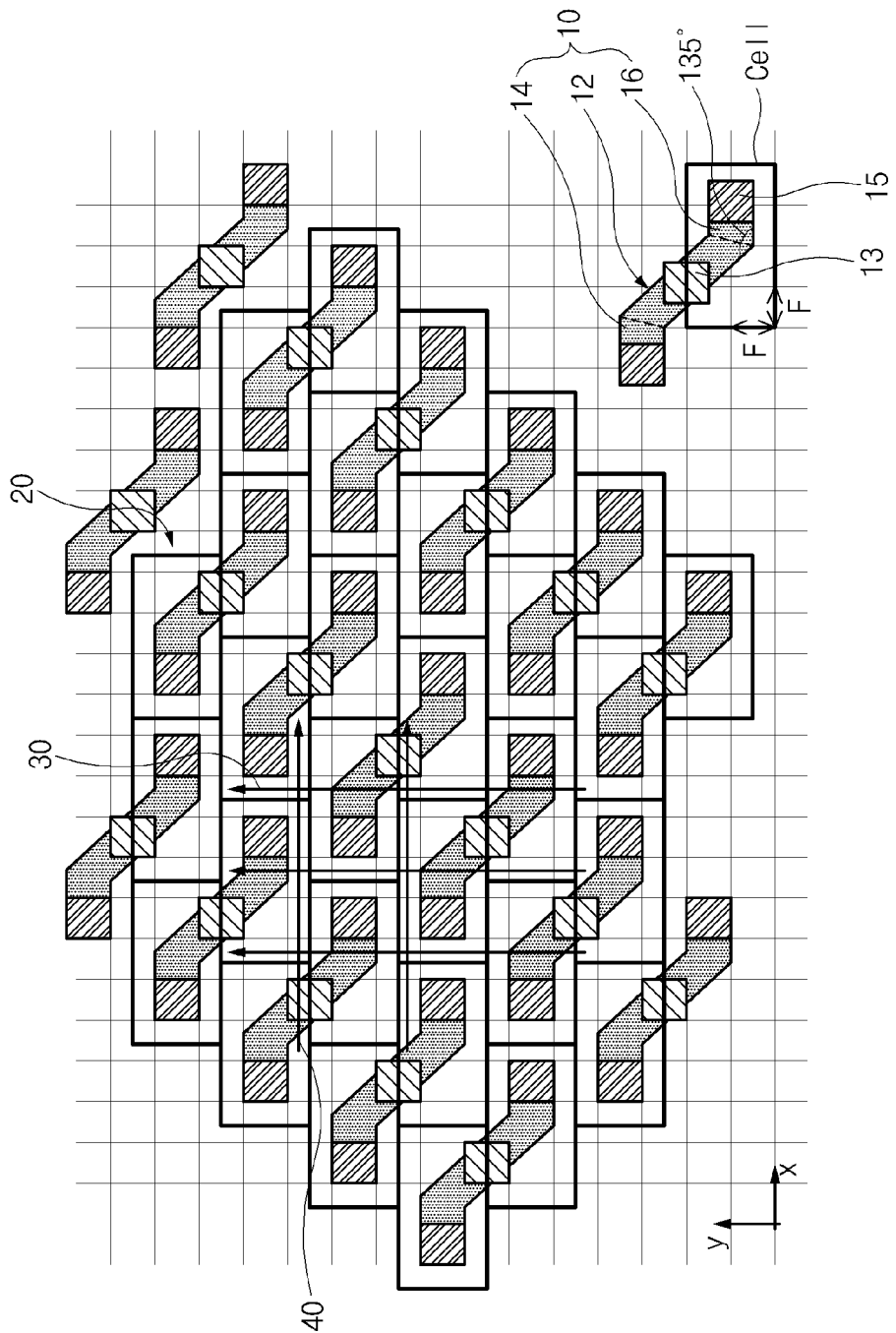
FIG. 2 to FIG. 6 show a layout for a semiconductor device according to an embodiment of the present invention.
Figure 3:
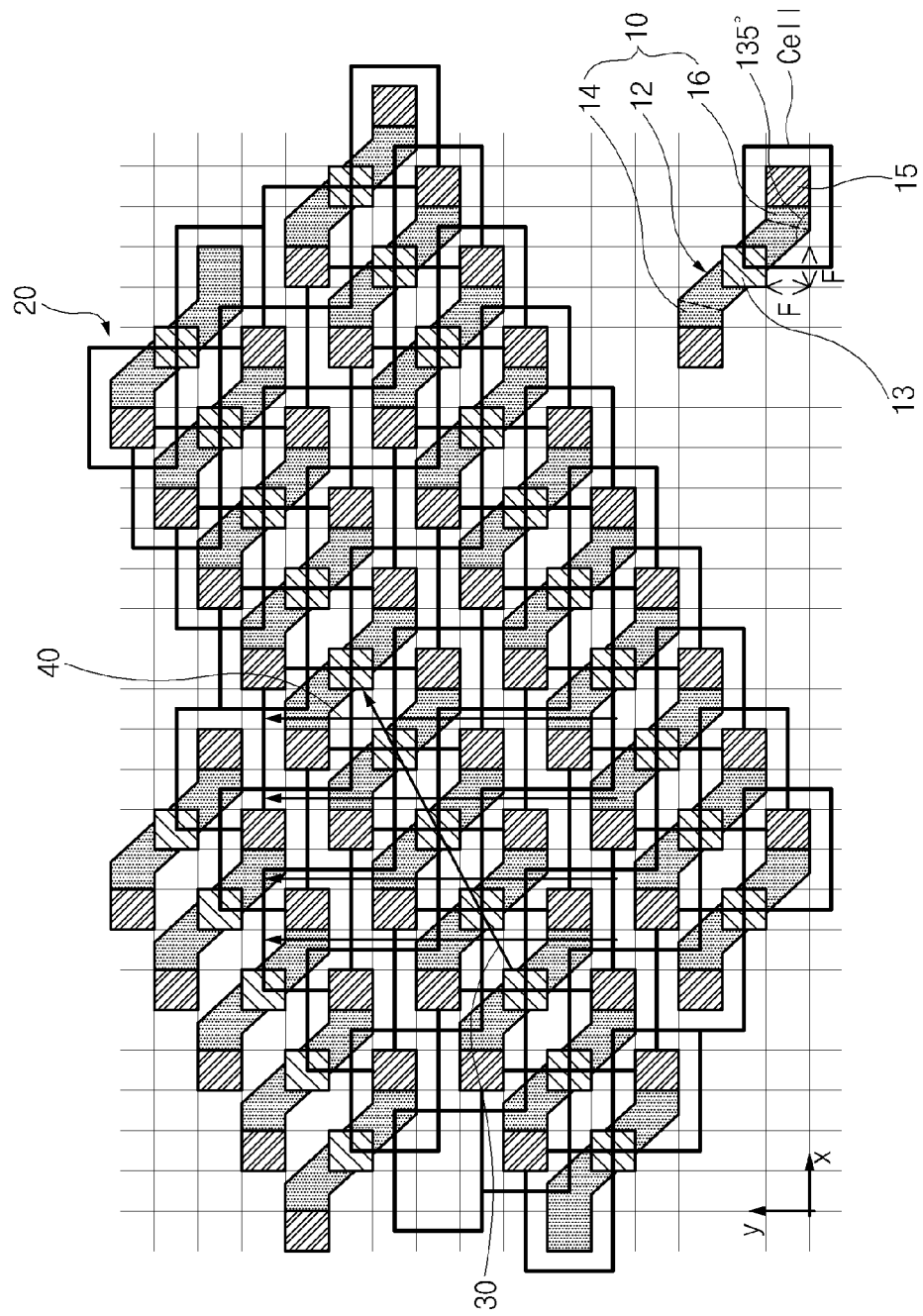
Figure 4:
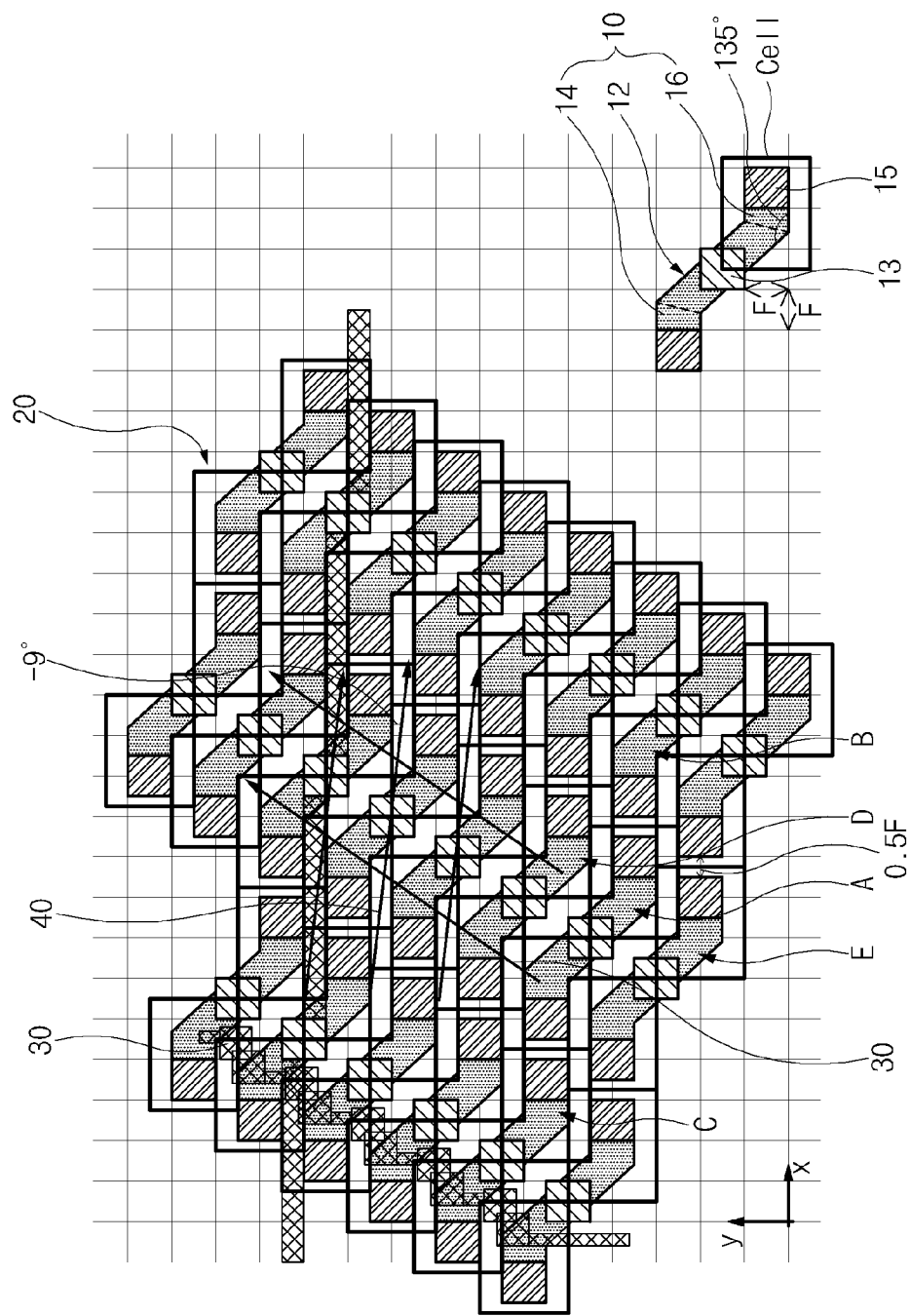

FIG. 2 to FIG. 4 show a layout for a semiconductor device according to one embodiment of the present invention. An active region 10 shown in FIG. 2 to FIG. 4 has substantially the same configuration and structure. One difference is that the layout arrangement of active regions 10 around a device isolation film 20 differs from one another. The layout shown in FIG. 2 illustrates the 8F2 layout, the layout shown in FIG. 3 illustrates the 6F2 layout, and the layout shown in FIG. 4 illustrates the 5.5F2 layout.

In the following, a common construction among the active regions 10 in FIG. 2 to FIG. 4 will first be explained, followed by the layout arrangement of each active region 10 and a method thereof in order.

Each active region 10 has first and second ends 14 and 16 that are bent. That is, on the basis of the squares plotted in FIG. 2 to FIG. 4, the inclined portion 12 is tilted at about 45°, and both ends of the inclined portion 12 are tilted at a predetermined angle and extended in the transverse direction. The first and second ends 14 and 16 are formed transversely and the inclined portion 12 is formed at a tilt angle of 45° from the transverse direction. As a result, the first end 14 and the second end 16 are at an angle of 125° to 145°, preferably about 135° with respect to the inclined portion 12. The cell density can be increased by tilting the inclined portion 12 at about 35° to about 75° from the transverse direction. In one implementation, the highest cell density was achieved when the is inclined portion 12 is tilted at 45° as in this embodiment.

The inclined portion 12 in each of the active regions 10 includes a bit-line contact region 13. Each of the first and second ends 14 and 16 includes a storage node contact region 15. A bit line 40 is formed passing each bit-line contact region 13, and a capacitor (not shown) is formed on the top of each storage node contact region 16.

A portion between the bit-line contact region 13 and the storage node contact region 15 in the inclined portion 12 of the active region 10 becomes a gate region. In one embodiment, each of the first end and second ends includes a portion of the gate region. A word line 30 is formed to pass two gate regions of each active region 10. A gate is formed at a portion of intersection of the word line 30 and the active region 10, and ions are implanted into the active regions 10 on either side of the gate to form a junction region for a source and a drain. These source, drain and gate together define a transistor. One transistor and one capacitor define one cell.

Hereinafter, it will be explained how active regions 10 having the above-described configuration can be laid out, with reference to the embodiments shown in FIG. 2 to FIG. 4.

In FIG. 2, active regions 10 are arranged in a manner that they are spaced apart from each other in both transverse and longitudinal directions by 1F (here, 'F' indicates a minimum critical dimension of a semiconductor device, which corresponds to the width of the active region 10, word line 40 or bit line 30). The word line 30 is formed in the longitudinal direction, while the bit line 40 is formed in the horizontal direction. As a result, a cell is including one transistor and one capacitor is formed within a 4F (transverse direction)×2F (longitudinal direction) or 8F$^2$ area, and the cell density comparable to that of the conventional 8F2 layout is therefore achieved.

FIG. 3 shows active regions 10 that are arranged at a higher density than in FIG. 2. Adjacent active regions 10 are shifted by 1F in a longitudinal direction and 2F in a transverse direction from each other. The first ends 14 of the adjacent active regions 10 are spaced apart from each other by 1F in the transverse direction (i.e. 1F gap). The word line 40 is formed in the longitudinal direction, while the bit line 30 is formed at about 27° angle from the X axis in the right upward direction.

As a result, a cell including one transistor and one capacitor is formed within a 3F (transverse direction)×2F (longitudinal direction) or 6F² area. The cell density comparable to that of the conventional 6F2 layout is achieved.

FIG. 4 shows active regions 10 that are arranged at a higher density than in FIG. 2 and FIG. 3. Adjacent active regions 10 are shifted by about 1F transversely and about 1.5F longitudinally from each other. The second end 16 of the active region 10 located on the left side and the first end 14 of the active region 10 located on the right side are formed at the same height in the Y axis direction and have a gap (or the transverse distance therebetween) is in a range of 0.4F to 0.6F, preferably 0.5F.

The second end 16 of the active region 10 located on the upper side and the second end 16 of the active region 10 located on the lower side has a gap of 0.4F to 0.6F (preferably 0.5F) in the Y axis direction.

Further, the word line 30 is formed at about 56° from the X axis in the right upward direction, and the bit line 40 is tilted at −5° to −13° (preferably, −9°) from the X axis in the right downward direction. In one active region 10, two word lines 30 intersect and one bit line 40 intersects. The tilt angles of the word lines 30 and bit line 40 from the transverse direction are determined by an angle of the inclined portion of the active region 10, and the word lines 30 preferably perpendicularly intersect the inclined portion 12 of the active region 10 in view of securing a space for the formation of bit lines and word lines and of increasing the cell density (for convenience, only one word line 30 and one bit line 40 are illustrated in FIG. 4).

As the bit line 40 is formed as a tilted structure, not in the perpendicular direction, a sufficient gap is secured between bit lines 40 and the margin with the storage node contact is improved. This in turn makes it possible to prevent SAC failure during a subsequent formation of a storage node contact.

To explain the layout of the active region 10 again with reference to FIG. 4, four different active regions 10 are located in every direction of an active region 10 (suppose this is a first active region A). Likewise, those four active regions 10 can be named as a right active region B, a left active region C, an upper active region D and a lower active region E, respectively. Since each cell is formed of these active regions 10 arranged in a uniform pattern in continuous and repetitive manners, the relationship among these fine active regions 10 (A, B, C, D and E) defines the layout of active regions 10 within the entire cell.

The second end of the first active region A is formed in a transverse position with the first end of the right active region B, and the first end of is the first active region A is formed in a transverse position with the second end of the left active region C. Also, a transverse distance between the second end of the first active region A and the first end of the right active region B as well as a transverse distance between the first end of the first active region A and the second end of the left active region C are in a range of 0.4F to 0.6F (preferably 0.5F).

Further, a straight line formed by connecting the second end of the upper active region D, the second end of the first active region A and the second end of the lower active region E is normal to the inclined portion. Moreover, a vertical distance between the second end of the upper active region D and the second end of the first active region A as well as a vertical distance between the second end of the first active region A and the second end of the lower active region E are in a range of 0.4F to 0.6F (preferably 0.5F).

Accordingly, by arranging active regions 10 in a manner shown in FIG. 4, the cell density in a semiconductor device can be increased. In case of the embodiment shown in FIG. 4, cells are formed in a 2.75F (transverse direction)×2F (longitudinal direction) or 5.5F² area, showing an about 8.33% improvement of the cell density compared with the 6F2 in the conventional art. For information, if peripheral circuit regions, besides the cell region, are included for calculation, the unit cell area in the entire wafer could be reduced by 5.66%.

Another advantage that can be obtained by arranging active regions 10 with this layout on a semiconductor substrate is that the formation of active regions 10 becomes easier than in the conventional methods.

Figure 5:
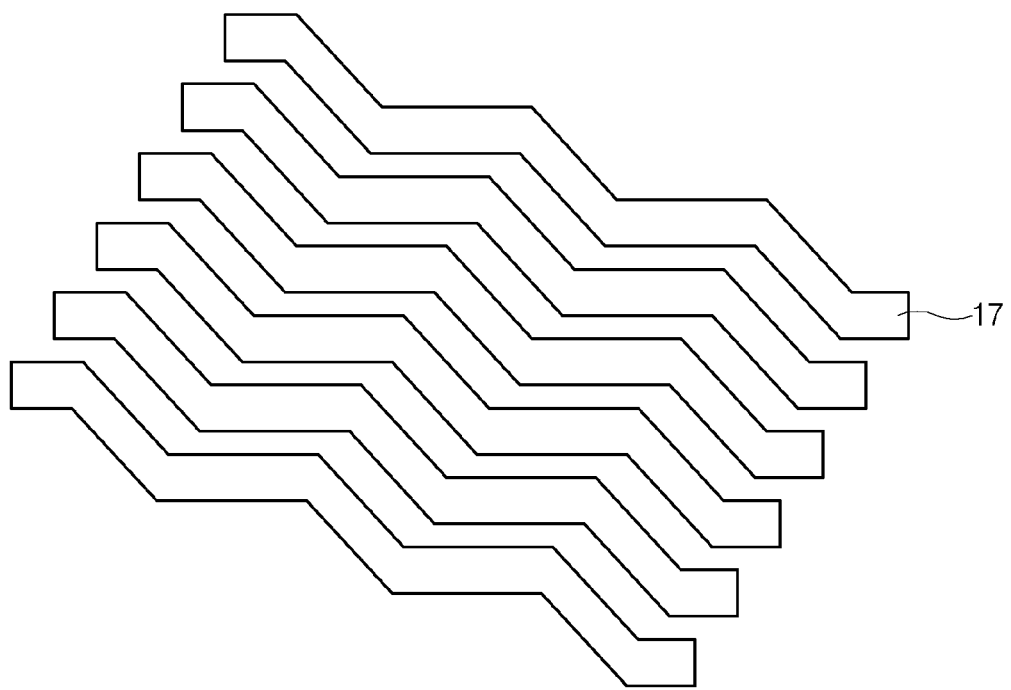

In case of the embodiments illustrated in FIG. 2 or FIG. 4, two transversely adjacent active regions 10 have their ends 14 and 16 arranged in line with each other. Thus, the active regions 10 are not formed individually, but in a different way. In other words, as shown in FIG. 5, active regions 10 has a line and space pattern 17 in a continuous curved line form, and then individual active regions 10 are formed by cutting those adjoining active regions in the transverse direction.

In particular, even the device isolation film 20 for defining active regions 10 can be formed in many ways, but STI (Shallow Trench Isolation) process that includes forming a thin trench in a semiconductor substrate and then filling the trench with an oxide film to form a device isolation film 20 is often used. Here, if the trench for the formation of the device isolation film 20 is formed in the line and space pattern before it is filled with the oxide film, those transversely adjacent active regions 10 as illustrated in FIG. 2 or FIG. 4 could have a continuous pattern of active regions 17 as shown in FIG. 5.

Figure 6:
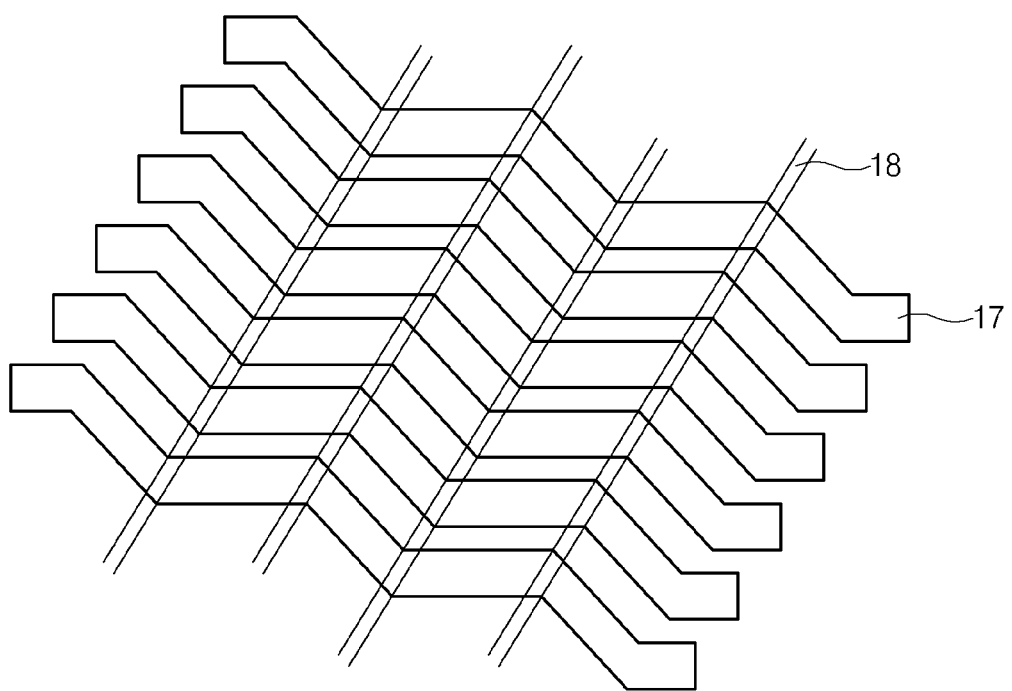

Later, a special mask is used to separate the transversely adjacent active regions 10 from each other and to etch a trench in a space having the width of 0.4F to 0.6F (preferably, 0.5F) between the active regions 10, and then the device isolation oxide film is filled again to separate the active regions 10 from each other. The mask used for separating those adjacent active regions 10 may be a contact hole mask, or a line type mask 18 as illustrated in FIG. 6.

The separation of the adjacent active regions 10 can also be applied to the formation of a storage node contact. That is to say, in the is embodiment shown in FIG. 4, for example, since active regions 10 are arranged by adjoining each other, those storage node contact regions 15 adjoining each other are not formed individually, but are separated from one storage node contact that is common to the adjacent active regions 10. In this manner, a storage node contact of those adjacent active regions 10 can easily be formed.

To be more specific, a storage node contact including the first end 14 of the first active region A and the second end 16 of the left active region C is first formed, and the storage node contact is then separated using the same mask as the separation mask 18 (see FIG. 6) for the active regions 10, thereby separating the storage node contact of the first and left active regions. This process is equally applied to the second end 16 of the first active region A and the first end 14 of the right active region B.

The layout for a semiconductor device and the fabrication method of the semiconductor device according to the present invention are advantageous in that a larger number of capacitors can be formed in a given area, leading to an increase in the cell density, and a larger number of semiconductor chips can be obtained from one wafer, and SAC failure of the storage node can be prevented by retaining a sufficient gap between bit lines.

The above embodiments of the present invention are illustrative and not limitative. Various alternatives and equivalents are possible. The invention is not limited by the embodiments described herein. Nor is the invention limited to any specific type of semiconductor device. Other additions, subtractions, or modification are obvious in view of the present is disclosure and are intended to fall within the scope of the appended claims.

What is claimed is:

1. A semiconductor device comprising:
    a plurality of active regions defined by device isolation films;
    a plurality of word lines extending across the plurality of active regions and diagonal to an X-axis of a layout grid;
    wherein the active regions comprises a first active region, a right active region located on a right side of the first active region, a left active region located on a left side of the first active region, an upper active region located on an upper side of the first active region and a lower active region located on a lower side of the first active region; and
    wherein each active region includes:
    an inclined portion having a bit-line contact region, the inclined portion arranged perpendicular to the word lines;
    a first portion having a first storage node contact region and extending along a first direction parallel to the X-axis from a first end of the inclined portion; and
    a second portion having a second storage node contact region and extending along a second direction parallel to the X-axis from a second end of the inclined portion.

2. The semiconductor device according to claim 1, wherein the first and second ends of the active region are formed at an angle of 135° with respect to the inclined portion, wherein the first and second directions are directions extending in opposite directions.

3. The semiconductor device according to claim 1, wherein the area of a unit cell constituted by a part of the inclined portion and the first end is $5.5F^2$, the "F" being a width of the active region.

4. The semiconductor device according to claim 1, wherein the second end of the first active region is formed at substantially the same height with the first end of the right active region, and the first end of the first active region is formed at substantially the same height with the second end of the left active region.

5. The semiconductor device according to claim 1, wherein the second end of the first active region and the first end of the right active region are separated by about 0.5F, and the first end of the first active region and the second end of the left active region are separated by about 0.5F, and
    wherein "F" is a width of the active region.

6. The semiconductor device according to claim 1, wherein a straight line formed by connecting the second end of the upper active region, the second end of the first active region and the second end of the lower active region is substantially orthogonal to the inclined portion.

7. The semiconductor device according to claim 1, wherein the second end of the upper active region and the second end of the first active region are separated by about 0.5 F vertically, the second end of the first active region and the second end of the lower active region are separated by about 0.5F vertically,
    wherein "F" is a width of the active region.

8. The semiconductor device according to claim 1, further comprising:
    a bit line extending right-downwardly with respect to the first active region.

9. The semiconductor device according to claim 8, wherein the bit line has a tilt angle of about −9° with respect to the X-axis.

10. A method of fabricating a semiconductor device, the method comprising:
    forming a plurality of active regions defined by device isolation films;
    providing word lines extending in a first direction diagonal to an X-axis of a layout grid;
    providing bit lines extending in a second direction, the bit lines intersecting the word lines; and
    providing a first active region, a right active region located on a right side of the first active region, a left active region located on a left side of the first active region, an upper active region located on an upper side of the first active region and a lower active region located on a lower side of the first active region, and
    wherein each active region includes an inclined portion arranged in a third direction and having a bit-line contact region, a first portion having a first storage node contact region and extending parallel to the X-axis from a first end of the inclined portion, and a second portion having a second storage node contact region and extending parallel to the X-axis from a second end of the inclined portion, and
    wherein the first direction is perpendicular to the third direction.

11. The method according to claim 10, further comprising:
    forming a line-type active region pattern with the first active region, the left active region and the right active region; and
    forming device isolation films for separating the first end of the first active region and the second end of the left active region and for separating the second end of the first active region and the first end of the right active region.

12. The method according to claim 11, wherein the formation of the device isolation films are performed using a contact hole mask.

13. The method according to claim 11, wherein the formation of the device isolation films are performed using a line-type mask.

14. The method according to claim 10, further comprising:
    after the formation of the active regions, forming a storage node contact between the first end of the first active region and the second end of the left active region and between the second end of the first active region and the first end of the right active region; and
    separating the storage node contact between the first end of the first active region and the second end of the left active region and between the second end of the first active region and the first end of the right active region.

15. The method according to claim 10, wherein the first and second ends of the active region are formed at an angle of 135° with respect to the inclined portion.

16. The method according to claim 10, wherein the second end of the first active region has substantially the same height as the first end of the right active region, and the first end of the first active region has substantially the same height as the second end of the left active region.

17. The method according to claim 10, wherein the bit line is tilted right-downwardly with respect to the X-axis.

18. The method according to claim 17, wherein the bit line has a tilt angle of about −9° with respect to the X-axis.

* * * * *